(12) United States Patent
Rajendran et al.

(10) Patent No.: US 8,217,723 B2
(45) Date of Patent: Jul. 10, 2012

(54) LOW NOISE AMPLIFIER CIRCUIT

(75) Inventors: Gireesh Rajendran, Trivandrum (IN); Ashish Lachhwani, Bangalore (IN); Rakesh Kumar, Ghazipur (IN)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 12/612,691

(22) Filed: Nov. 5, 2009

(65) Prior Publication Data
US 2011/0102088 A1    May 5, 2011

(51) Int. Cl.
*H03F 1/22* (2006.01)
(52) U.S. Cl. ........................ 330/311; 330/305
(58) Field of Classification Search .................. 330/302, 330/305, 311, 277
See application file for complete search history.

(56) References Cited

U.S. PATENT DOCUMENTS

| | | | | |
|---|---|---|---|---|
| 3,701,035 | A * | 10/1972 | Chikuma | 330/305 |
| 5,015,968 | A * | 5/1991 | Podell et al. | 330/302 |
| 6,046,641 | A * | 4/2000 | Chawla et al. | 330/277 |
| 7,023,272 | B2 * | 4/2006 | Hung et al. | 330/311 |
| 7,057,464 | B2 * | 6/2006 | Bharj | 330/302 |
| 7,719,352 | B2 * | 5/2010 | Kim et al. | 330/307 |
| 7,786,806 | B2 * | 8/2010 | Duperray | 330/311 |

* cited by examiner

*Primary Examiner* — Khanh V Nguyen
(74) *Attorney, Agent, or Firm* — Lawrence J. Bassuk; W. James Brady; Frederick J. Telecky, Jr.

(57) ABSTRACT

Low noise amplifier circuit. The low noise amplifier circuit includes an amplifier that amplifies an input to provide an output. The amplifier is coupled to an input terminal. The circuit also includes a device in a cascode connection with the amplifier. The circuit further includes a tuning circuit coupled to the device to phase shift the output. Further, the circuit includes a feedback circuit that is responsive to a phase-shifted output to enhance gain of the amplifier. The feedback circuit is coupled to the tuning circuit and the amplifier.

16 Claims, 3 Drawing Sheets

LOW NOISE AMPLIFIER CIRCUIT

TECHNICAL FIELD

Embodiments of the disclosure relate to an amplifier circuit.

BACKGROUND

A Low Noise Amplifier (LNA) is a device used as a front end to amplify signals in several applications, for example radio frequency receivers. A common-source architecture of the LNA provides low noise as compared to a common-gate architecture. However, the common-source architecture requires additional components for impedance and noise matching which in turn increases area.

An exemplary LNA 100 with a common-gate architecture is illustrated in FIG. 1 (Prior Art). An amplifier 105 and a device 110 are coupled in a cascode connection, and provide an output at a drain of the device 110. A source of the amplifier 105 is coupled to an input terminal 155 that is connected to a signal source or antenna. An equivalent of the signal source or the antenna is shown as a resistor 160. Impedance matching is performed by an impedance matching circuit 140 that includes an inductor 145 and a capacitor 150 in a parallel connection. The impedance matching circuit 140 matches an impedance of a load 120 that includes a parallel connection of an inductor 125 and a capacitor 130 with impedance present at the input terminal 155. A noise for the LNA 100 is presented in equation (1).

$$Fo = 1 + (i_n^2/i_s^2) * 1/(gmRs)^2 \quad (1)$$

where Fo is a reference noise factor, $i_n^2$ is an equivalent noise of the amplifier 105 and the device 110, $i_s^2$ is an equivalent noise of the resistor 160, gm is a transconductance of the amplifier 105, and Rs is an equivalent resistance of the signal source or the antenna.

From equation (1), the noise for the LNA 100 with the common-gate architecture is found to be greater than that of an LNA with the common-source architecture. Hence, it is desired to improve noise performance of the LNA, for example the LNA 100 having the common-gate architecture.

SUMMARY

An example of a circuit includes an amplifier that amplifies an input to provide an output. The amplifier is coupled to an input terminal. The circuit also includes a device in a cascode connection with the amplifier. Further, the circuit includes a tuning circuit coupled to the device to phase shift the output. Moreover, the circuit includes a feedback circuit that is responsive to a phase-shifted output to enhance gain of the amplifier. The feedback circuit is coupled to the tuning circuit and the amplifier.

Another example of a circuit includes an amplifier coupled to an input terminal. The amplifier has a gate and a source. A biasing circuit is coupled to the gate of the amplifier. An impedance matching circuit is further coupled to the source of the amplifier. A device defines a first output at a first output terminal. The device is in a cascode connection with the amplifier. Further, a tuning circuit defines a second output at a second output terminal. The tuning circuit is coupled to the device. A feedback circuit is responsive to a phase-shifted output to enhance gain of the amplifier. The feedback circuit is coupled to the second output terminal and to the gate of the amplifier.

An example of a method for enhancing noise performance of an amplifier includes amplifying an input, by the amplifier, to provide an output. Phase of the output is then shifted. Further, a feedback signal is generated based on a phase-shifted output. Gain of the amplifier is enhanced based on the feedback signal.

BRIEF DESCRIPTION OF THE VIEWS OF DRAWINGS

In the accompanying figures, similar reference numerals may refer to identical or functionally similar elements. These reference numerals are used in the detailed description to illustrate various embodiments and to explain various aspects and advantages of the disclosure.

DETAILED DESCRIPTION OF THE EMBODIMENTS

Figure 1:
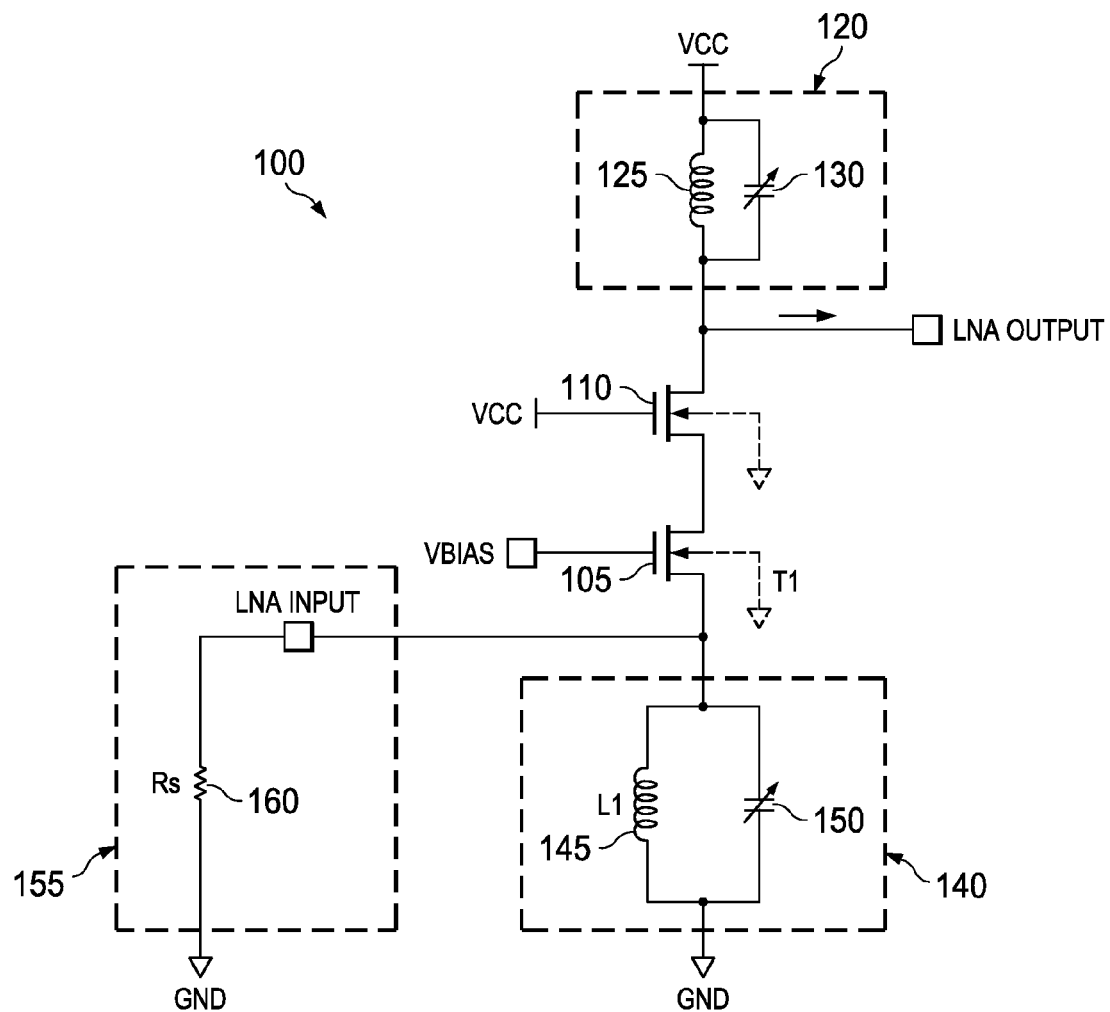
FIG. 1 illustrates a circuit, in accordance with prior art.
Figure 2:
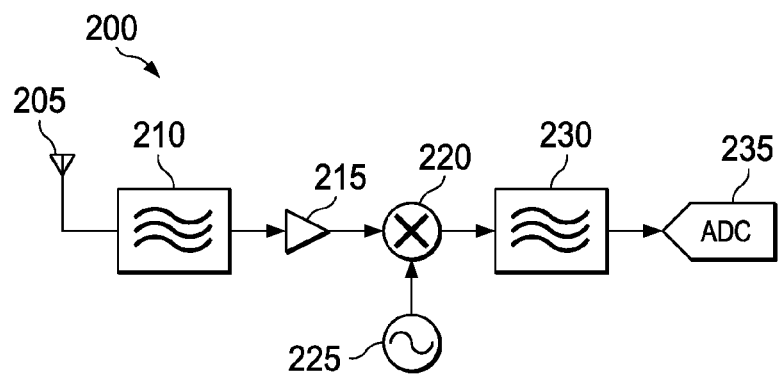
FIG. 2 illustrates an environment, in accordance with one embodiment.

FIG. 2 illustrates an environment 200, for example a wireless receiver. The wireless receiver includes an antenna 205, a filter 210, an amplifier circuit 215, a mixer 220, an oscillator 225, a filter 230, and an analog-to-digital converter (ADC) 235. The filter 210, for example a band pass filter, filters a signal received through the antenna 205. The amplifier circuit 215, for example a low noise amplifier (LNA), amplifies the signal. The mixer 220 down-converts the signal to an intermediate frequency by multiplying the signal with a signal that is generated by the oscillator 225. The filter 230 is an intermediate frequency filter that attenuates unwanted frequency components from the down-converted signal. The ADC 235 converts the intermediate frequency signal to a digital output.

Figure 3:
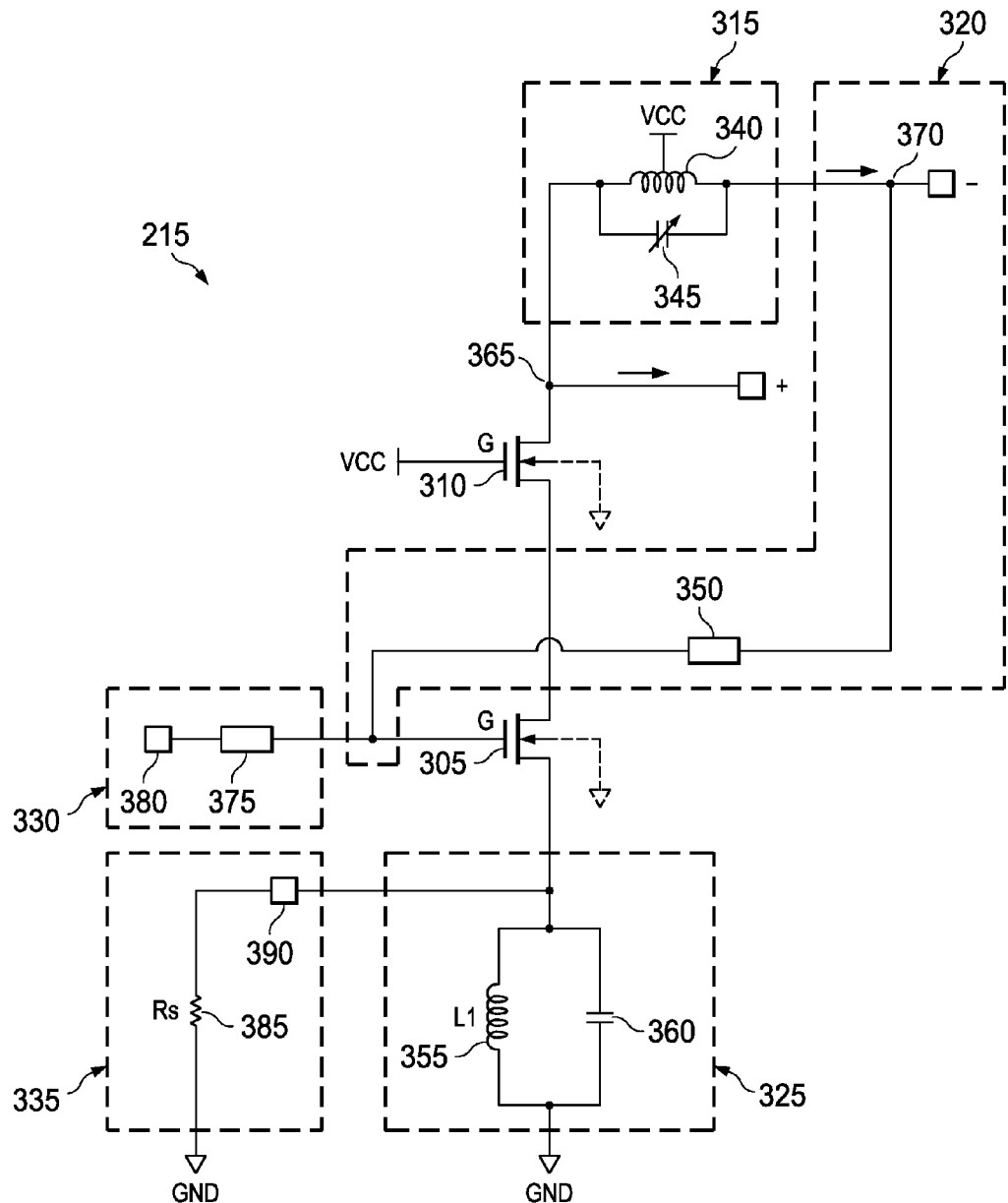
FIG. 3 illustrates a circuit, in accordance with one embodiment.

The amplifier circuit 215 having a desired noise and desired gain is explained in conjunction with FIG. 3.

Referring now to FIG. 3, the amplifier circuit 215 includes an amplifier 305, a device 310, a tuning circuit 315, and a feedback circuit 320. The amplifier 305 is coupled to an input terminal 390 of an input source 335. The device 310 is coupled in a cascode connection with the amplifier 305. The tuning circuit 315 is coupled to the device 310 and provides a phase shifted output. The feedback circuit 320 is coupled to the tuning circuit 315 and the amplifier 305.

The amplifier 305, for example a common-gate amplifier, has a drain coupled to a source of the device 310, a source coupled to the input terminal 390, and a gate coupled to a biasing circuit 330.

The device 310, for example a common-source amplifier, has a drain coupled to one terminal of the tuning circuit 315 and to a first output terminal 365, hereinafter referred to as the output terminal 365, and a gate coupled to a voltage supply (VCC). A first output is obtained at the output terminal 365.

The tuning circuit 315 includes an inductor 340 and a capacitor 345 coupled in a parallel connection. The capacitor 345 can be a capacitor with variable capacitance. The tuning circuit 315 has another terminal coupled to a second output terminal 370, hereinafter referred to as the output terminal 370. A second output is obtained at the output terminal 370.

The feedback circuit 320 is coupled between the output terminal 370 and the gate of the amplifier 305. The feedback circuit 320 includes an attenuator 350, for example a variable capacitor.

The amplifier circuit 215 further includes an impedance matching circuit 325. The impedance matching circuit 325 includes an inductor 355 and a capacitor 360 coupled in the parallel connection. The impedance matching circuit 325 is coupled between the source of the amplifier 305 and a ground supply (GND).

The amplifier circuit 215 also includes the biasing circuit 330 that is coupled to the gate of the amplifier 305. The biasing circuit 330 can include a passive element 375, for example a resistor, that is coupled between a voltage bias terminal 380 and the gate of the amplifier 305. The voltage bias terminal 380 can in turn be coupled to various circuits, for example a circuit including a diode and a current source, that generate a biasing voltage.

In some embodiments, the input source 335 includes the input terminal 390 and a resistor 385 coupled between the source of the amplifier 305 and the ground supply. In some embodiments, the amplifier 305 and the device 310 are negative channel metal-oxide semiconductor (NMOS) type transistors.

The amplifier 305 receives an input, for example a voltage signal, through the input terminal 390. The impedance matching circuit 325 matches input impedance of the tuning circuit 315 with the impedance present at the input terminal 390. The biasing circuit 330 biases the amplifier 305 to operate desirably. The amplifier 305, which is in the cascode connection with the device 310, amplifies the input to provide an output at the output terminal 365. The device 310 prevents reduction in transconductance of the amplifier 305. The tuning circuit 315 phase-shifts the output to provide a phase-shifted output, for example a 180 degree phase-shifted output, at the output terminal 370. In some embodiments, the tuning circuit 315 resonates at a frequency similar to that of the input source 335 to generate the phase-shifted output. The feedback circuit 320 provides a feedback signal at the gate of the amplifier 305, which is attenuated in magnitude, using the attenuator 350, and phase shifted, for example by 180 degrees, as compared to the input at the source of the amplifier 305. The feedback signal serves as a positive feedback that improves the transconductance of the amplifier 305. The improvement in transconductance enhances gain of the amplifier circuit 215 and decreases noise.

A total gain (G) of the amplifier circuit 215 can be determined as a product of the transconductance of the amplifier 305 and an output impedance of the output terminal 370. The transconductance of the amplifier 305 increases due to the positive feedback which is sum of gain of forward path and gain of feedback path. The forward path includes the input source 335, the amplifier 305, the device 310, the output terminal 365 and the tuning circuit 315, and the feedback path includes the tuning circuit 315, the output terminal 370, the attenuator 350, and the gate of the amplifier 305.

A reference noise factor (Fo) of an amplifier circuit without a feedback signal can be represented as $$Fo = 1 + (i_n^2/i_s^2) * 1/(gm*Rs)^2 \quad (2)$$

where $i_n^2$ is equivalent noise of the amplifier 305 and the device 310, $i_s^2$ is equivalent noise of the resistor 385, gm is the transconductance of the amplifier 305, and Rs is the impedance of the resistor 385.

A noise factor (Fo') of the amplifier circuit 215 in the presence of the feedback signal is illustrated in equation (3).

$$Fo' = 1 + (i_n^2/i_s^2) * 1/(gm*Rs*(1+A))^2 \quad (3)$$

A noise factor (F) of the amplifier circuit 215 can be determined using equation (2) and equation (3) as $$F = (Fo' - (A/A+1))^2)/(1 - (A/A+1))^2) \quad (4)$$

The gain of feedback path can be referred to as a feedback gain (A) and can be defined as A=alpha 1*alpha 2, where alpha 1 is a voltage gain of the forward path and alpha 2 is an attenuation factor obtained from the feedback circuit 320.

In some embodiments, the attenuation factor is less than 1.

Figure 4:
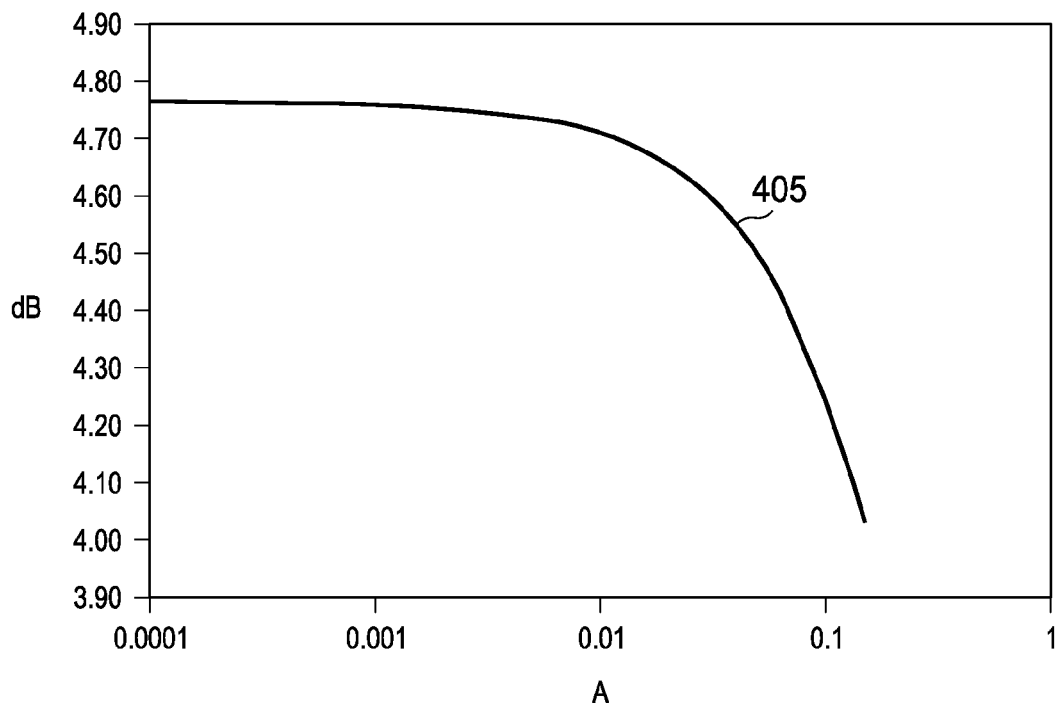
FIG. 4 is a graphical representation illustrating effect of noise on gain of a circuit, in accordance with one embodiment.

FIG. 4 is a graphical representation illustrating effect of the noise on the gain of the amplifier circuit 215. X-axis represents the feedback gain (A) of the amplifier circuit 215 and Y-axis represents the noise factor (F) in decibels (dB). The noise factor (F) represents the noise of the amplifier circuit 215. A waveform 405 indicates a reduction in the noise factor (F) with increase in the feedback gain.

Figure 5:
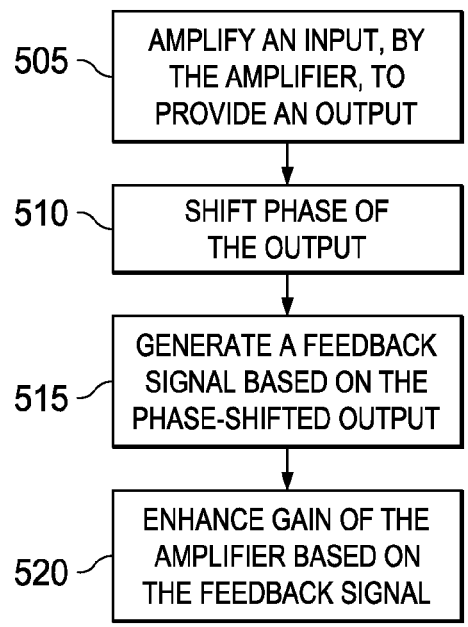
FIG. 5 is a flow diagram illustrating a method for enhancing noise performance of an amplifier, in accordance with one embodiment.

FIG. 5 illustrates a method for enhancing noise performance of an amplifier. A circuit, for example an amplifier circuit, includes an amplifier and a device in a cascode connection.

At step 505, an input is amplified, by the amplifier, to provide an output. The input, for example an input voltage or an input current, can be provided through an input terminal to a non-inverting node of the amplifier. Example of the non-inverting node includes a source of a common-gate amplifier. The output is proportional to the transconductance of the amplifier and the input to the amplifier.

In some embodiments, biasing of the amplifier is also performed.

At step 510, phase of the output is shifted. The output, for example a current, is phase-shifted, for example by a tuning circuit, to provide a phase-shifted output. The phase-shifted output can have a phase-shift of 180°.

At step 515, a feedback signal is generated based on the phase-shifted output. The feedback signal is generated by attenuating the feedback signal. In one example, the feedback signal can be attenuated using a feedback capacitor with variable capacitance.

At step 520, gain of the amplifier is enhanced based on the feedback signal. The feedback signal is fed to an inverting node of the amplifier to enhance the output and thereby control the gain of the amplifier. Example of the inverting node includes a gate of a common-gate amplifier. The transconductance and noise performance of the amplifier is also improved using the feedback signal.

In the foregoing discussion, the term "coupled" refers to either a direct electrical connection between the devices connected or an indirect connection through one or more passive or active intermediary devices. The term "circuit" means at least either a single component or a multiplicity of components, that are connected together to provide a desired function. The term "signal" means at least one current, voltage, charge, data, or other signal.

The foregoing description sets forth numerous specific details to convey a thorough understanding of embodiments of the disclosure. However, it will be apparent to one skilled in the art that embodiments of the disclosure may be practiced without these specific details. Some well-known features are not described in detail in order to avoid obscuring the disclosure. Other variations and embodiments are possible in light of above teachings, and it is thus intended that the scope of disclosure not be limited by this Detailed Description, but only by the Claims.

What is claimed is:

1. A circuit comprising:
    an amplifier, coupled to an input terminal, that amplifies an input to provide an output;
    a device in a cascode connection with the amplifier;
    a tuning circuit coupled to the device to phase shift the output; and
    a feedback circuit, coupled to the tuning circuit and the amplifier, that is responsive to a phase-shifted output to enhance gain of the amplifier.

2. The circuit as claimed in claim 1 and further comprising: an impedance matching circuit coupled to the amplifier to match an input impedance of the tuning circuit with an impedance present at the input terminal.

3. The circuit as claimed in claim 2, wherein the impedance matching circuit comprises: an inductor; and a capacitor in parallel connection with the inductor.

4. The circuit as claimed in claim 1 and further comprising: a biasing circuit coupled to the amplifier.

5. The circuit as claimed in claim 1, wherein the amplifier comprises a common-gate amplifier.

6. The circuit as claimed in claim 1, wherein the amplifier and the device comprise negative metal oxide semiconductor (NMOS) type transistors.

7. The circuit as claimed in claim 1, wherein the tuning circuit comprises: an inductor; and a capacitor in parallel connection with the inductor.

8. The circuit as claimed in claim 1, wherein the feedback circuit comprises: an attenuator responsive to the phase-shifted output to attenuate the phase-shifted output.

9. The circuit as claimed in claim 1, wherein the device in the cascode connection with the amplifier prevents reduction in transconductance of the amplifier.

10. The circuit as claimed in claim 1, wherein the feedback circuit provides only positive feedback.

11. The circuit as claimed in claim 1, wherein the feedback circuit provides only positive feedback.

12. The circuit as claimed in claim 1, wherein the phase shift is 180 degrees.

13. The circuit as claimed in claim 1, wherein the phase shift is 180 degrees.

14. The circuit as claimed in claim 1, wherein the feedback circuit is decoupled from the input and avoids any loading to an input driver.

15. A circuit comprising:
    an amplifier coupled to an input terminal, and having a gate and a source; a biasing circuit coupled to the gate of the amplifier;
    an impedance matching circuit coupled to the source of the amplifier;
    a device, in a cascode connection with the amplifier, that defines a first output at a first output terminal;
    a tuning circuit, coupled to the device, that defines a second output at a second output terminal; and
    a feedback circuit, coupled to the second output terminal and to the gate of the amplifier, that is responsive to a phase-shifted output to enhance gain of the amplifier.

16. The circuit as claimed in claim 15, wherein the feedback circuit is decoupled from the input and avoids any loading to an input driver.

\* \* \* \* \*